(12) United States Patent
Chen et al.

(10) Patent No.: US 10,026,820 B2
(45) Date of Patent: Jul. 17, 2018

(54) SPLIT GATE DEVICE WITH DOPED REGION AND METHOD THEREFOR

(71) Applicant: FREESCALE SEMICONDUCTOR, INC., Austin, TX (US)

(72) Inventors: Weize Chen, Phoenix, AZ (US); Cheong Min Hong, Austin, TX (US); Konstantin V. Loiko, Austin, TX (US); Jane A. Yater, Austin, TX (US)

(73) Assignee: NXP USA, Inc., Austin, TX (US)

( * ) Notice: Subject to any disclaimer, the term of this patent is extended or adjusted under 35 U.S.C. 154(b) by 38 days.

(21) Appl. No.: 15/078,860

(22) Filed: Mar. 23, 2016

(65) Prior Publication Data

US 2017/0278937 A1    Sep. 28, 2017

(51) Int. Cl.
*H01L 29/423* (2006.01)
*H01L 27/11521* (2017.01)
*H01L 27/11568* (2017.01)
*H01L 21/8234* (2006.01)

(52) U.S. Cl.
CPC ......... *H01L 29/42344* (2013.01); *H01L 21/823412* (2013.01); *H01L 27/11521* (2013.01); *H01L 27/11568* (2013.01); *H01L 29/42328* (2013.01)

(58) Field of Classification Search
CPC ......... H01L 29/42344; H01L 29/42328; H01L 21/823412; H01L 27/11521; H01L 27/11568
USPC ....................................................... 257/432
See application file for complete search history.

(56) References Cited

U.S. PATENT DOCUMENTS

| | | | |
|---|---|---|---|
| 6,432,761 B1 | 8/2002 | Gerber et al. | |
| 7,101,743 B2 | 9/2006 | Li et al. | |
| 8,871,598 B1 * | 10/2014 | Perera | H01L 29/665 257/E21.422 |
| 8,895,397 B1 * | 11/2014 | Shum | H01L 27/11563 438/279 |
| 8,962,410 B2 | 2/2015 | Zhang et al. | |
| 2002/0102785 A1 | 8/2002 | Ho et al. | |
| 2010/0078703 A1 * | 4/2010 | Winstead | H01L 29/42328 257/324 |
| 2015/0333077 A1 * | 11/2015 | Tsai | H01L 21/26586 257/319 |
| 2015/0364478 A1 * | 12/2015 | Roy | H01L 27/1157 257/326 |

* cited by examiner

*Primary Examiner* — Marc Armand
*Assistant Examiner* — Sue Tang

(57) ABSTRACT

A method of forming a semiconductor device using a substrate includes forming a first select gate over the substrate, a charge storage layer over the first select gate, over the second select gate, and over the substrate in a region between the first select gate and the second select gate, wherein the charge storage layer is conformal, and a control gate layer over the charge storage layer, wherein the control gate layer is conformal. The method further includes performing a first implant that penetrates through the control gate layer in a middle portion of the region between the first select gate and the second select gate to the substrate to form a doped region in the substrate in a first portion of the region between the first select gate and the second select gate that does not reach the first select gate and does not reach the second select gate.

20 Claims, 15 Drawing Sheets

SPLIT GATE DEVICE WITH DOPED REGION AND METHOD THEREFOR

BACKGROUND

Field

This disclosure relates generally to semiconductor processing, and more specifically, to a split gate device with a doped region and method therefor.

Related Art

Nonvolatile memories are an important element in the design of electronic devices. An NVM is typically constructed with a plurality of NVM cells, each of which includes a separate charge storage element for storing electrical charge. One type of NVM uses split gate devices, in which each split gate device exhibits two distinguishable channel regions, respectively controllable by a select gate and a control gate. In one example, the control gate overlaps the select gate with a charge storage layer between the control gate and the select gate and between the control gate and the substrate. However, as the devices decrease in size, the issue of charge trap-up has become increasingly problematic. Trap-up results from trapped charges in the dielectric of the charge storage layer and is most significant at the source edge, wherein the control gate is closest to the substrate. During cycling, these trapped charges are difficult to remove and negatively impact the threshold voltage. Therefore, a need exists for an improved split-gate device which reduces the effects of the trapped charges.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In a split gate structure, a selective implant through part of the control gate layer places dopants at the channel surface region near the source edge. This implanted regions shields the trapped charges so as to reduce their influence on the bit cell's electrical characteristics. This implant region may be formed in a variety of ways at different processing stages.

Figure 1:
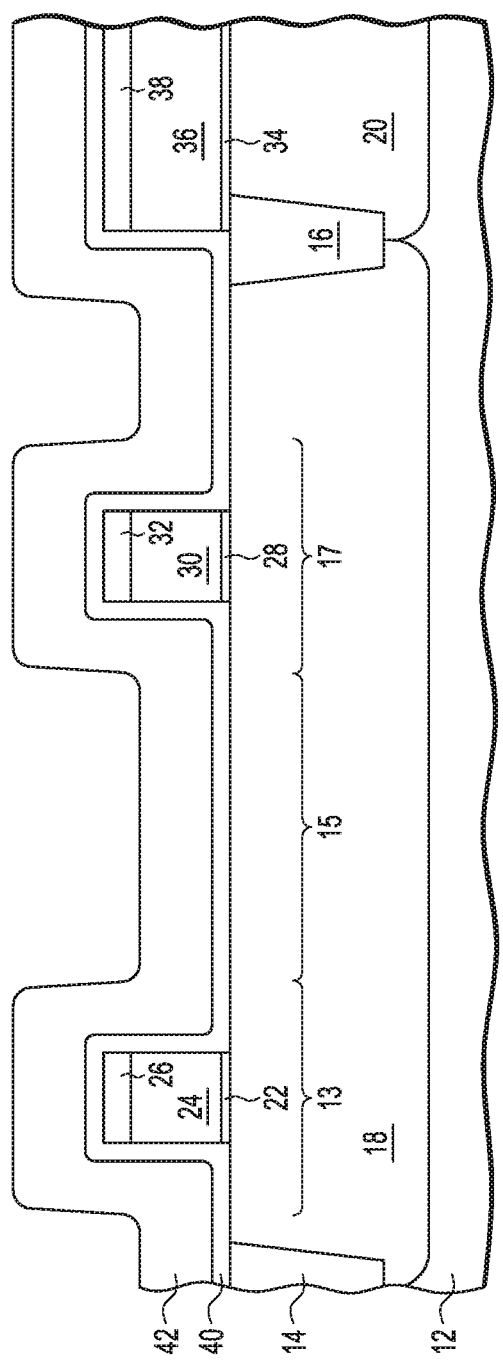
FIGS. 1-6 illustrate a semiconductor device at various processing stages in accordance with one embodiment of the present invention.

FIG. 1 illustrates a cross-sectional view of a semiconductor structure 10 at a processing stage. Structure 10 includes a semiconductor substrate 12 having isolation regions 14 and 16. Isolations regions 14 and 16 may be formed as known in the art with any dielectric material, such as, for example, an oxide. Substrate 12 also includes well 18 formed between isolation regions 14 and 16, and a well 20 formed between isolation region 16 and an adjacent isolation region (not shown in the cross-section of FIG. 1). In one embodiment, well 18 is a p-type well and well 20 is an n-type well. Structure 10 includes a select gate 24 formed over substrate 12 and a select gate 30 formed over substrate 12, laterally spaced apart from select gate 24. A gate dielectric 22 is located between select gate 24 and substrate 12 and a gate dielectric 28 is located between select gate 30 and substrate 12. Select gates 24 and 30 are formed over well 18. Structure 10 also includes a gate portion 36 formed over well 20 of substrate 12. A gate dielectric 34 is located between gate portion 36 and substrate 12. Each of select gate 24, select gate 30 and gate portion 36 have an anti-reflective coating (ARC) formed on top, such as ARC 26 formed on select gate 24, ARC 32 formed on select gate 30, and ARC 38 formed on gate portion 36. In one embodiment, a gate dielectric layer is formed over substrate 12, a gate layer is blanket deposited over the gate dielectric layer, and an ARC layer is blanket deposited over the gate layer. This stack of layers is then patterned to form select gate 24, select gate 30, and gate portion 36, along with the corresponding gate dielectrics and ARCs. In one embodiment, the gate dielectric layer includes oxide, the blanket deposited gate layer includes polysilicon, and the ARC layer includes nitride, oxide, or a combination thereof. Semiconductor substrate 12 can be any semiconductor material or combinations of materials, such as gallium arsenide, silicon germanium, silicon-on-insulator (SOI), silicon, monocrystalline silicon, the like, and combinations of the above.

Still referring to FIG. 1, a charge storage layer 40 is formed over substrate 12, including over select gate 24, select gate 30, and gate portion 36. Charge storage layer 40 may include one or more layers, such as a nitride layer, an oxide layer, or a combination thereof. Alternatively, charge storage layer 40 may include discrete charge storage elements, such as nanocrystals. The discrete charge storage elements may be, for example, polysilicon, and may be surrounded by an insulator material such as oxide. In yet another embodiment, floating gate devices may be formed in which charge storage layer 40 would be replaced with a first dielectric layer, a floating gate, and a second dielectric layer. A control gate layer 42 is then formed over charge storage layer 40. Control gate layer 42 is conformal over charge storage layer 40 and may be blanket deposited. Control gate layer 42 may include polysilicon and have a thickness in a range of 60 to 150 nanometers, or alternatively, 80 to 120 nanometers. In one embodiment, each of select gates 24 and 30 are doped with an n-type dopant and control gate layer 42 is undoped. Note that control gate layer 42 has a top surface further from a top surface of substrate 12 in a first region 13 over and laterally adjacent select gate 24 and a second region 17 over and laterally adjacent select gate 30 than in a third region 15 between select gates 24 and 30.

Figure 2:
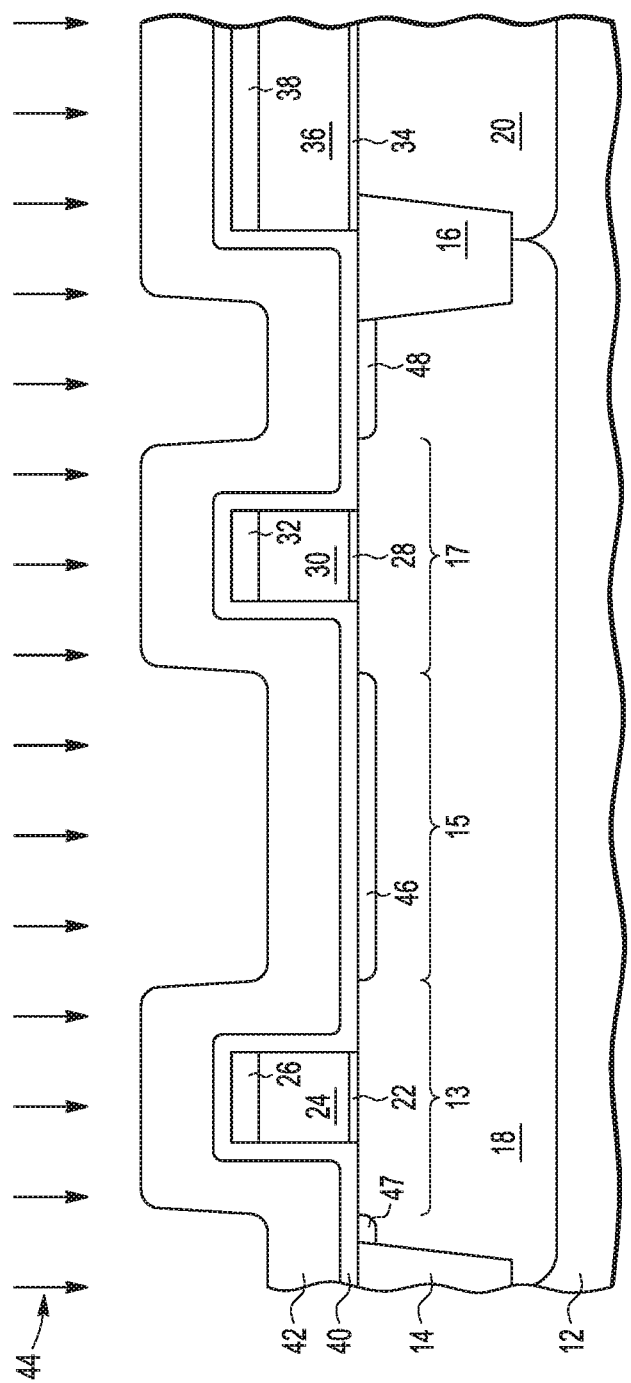

FIG. 2 illustrates a cross-sectional view of structure 10 at a subsequent processing stage. An implant 44 is performed to result in doped regions 47, 46, and 48. In one embodiment, an n-type implant is performed using a dopant such as, for example, phosphorous, arsenic, or antimony. Implant 44 is performed with an energy (or strength) such that a fraction of the dopants will penetrate through control gate layer 42 in region 15 into substrate 12 but not penetrate though control gate layer 42 in regions 13 and 17. Therefore, implant 44 only results in doped regions under those sections of control gate layer 42 in which the top surface is closer to the top surface of substrate 12, where the dopant has to penetrate less gate material (control gate material or select gate material). As seen in FIG. 2, the "shoulders" of control gate layer 42 on either side of the select gates in regions 13 and 17 are much thicker than control gate layer 42 in region 15. ARC layers 26, 32, and 38 also help stop the dopants from implant 44 from entering select gates 24 and 30 and gate portion 36. In one embodiment, doped regions 47, 46, and 48 have a resulting dopant concentration of $10^{18}$ to $10^{20}/cm^3$. In one embodiment, this concentration is about 2 orders of magnitude less than the source/drain regions of each device (to be formed at a later processing stage). In one embodiment, doped regions 47, 46, and 48 have a depth of about 10 to 100 nanometers into substrate 12. Alternatively, if a p-type implant is performed (such as if the devices formed are of an opposite conductive type), boron may be used as the dopant.

Figure 3:
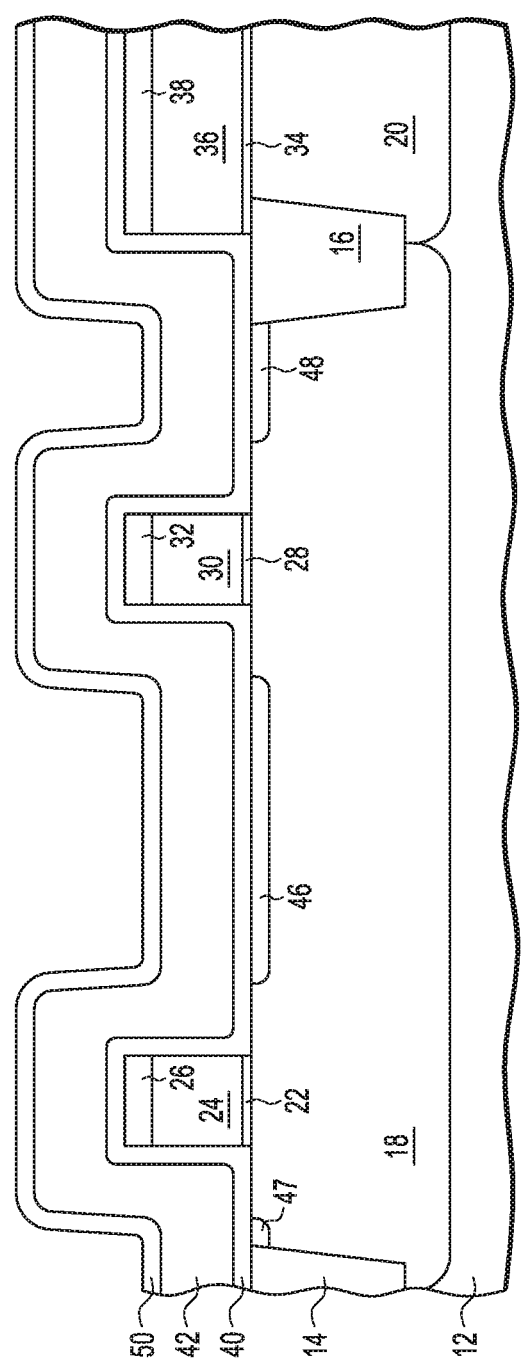

FIG. 3 illustrates a cross-sectional view of structure 10 at a subsequent processing stage. An ARC layer 50 is formed over control gate layer 42. ARC layer 50 includes an insulating layer, such as nitride or oxynitride.

Figure 4:
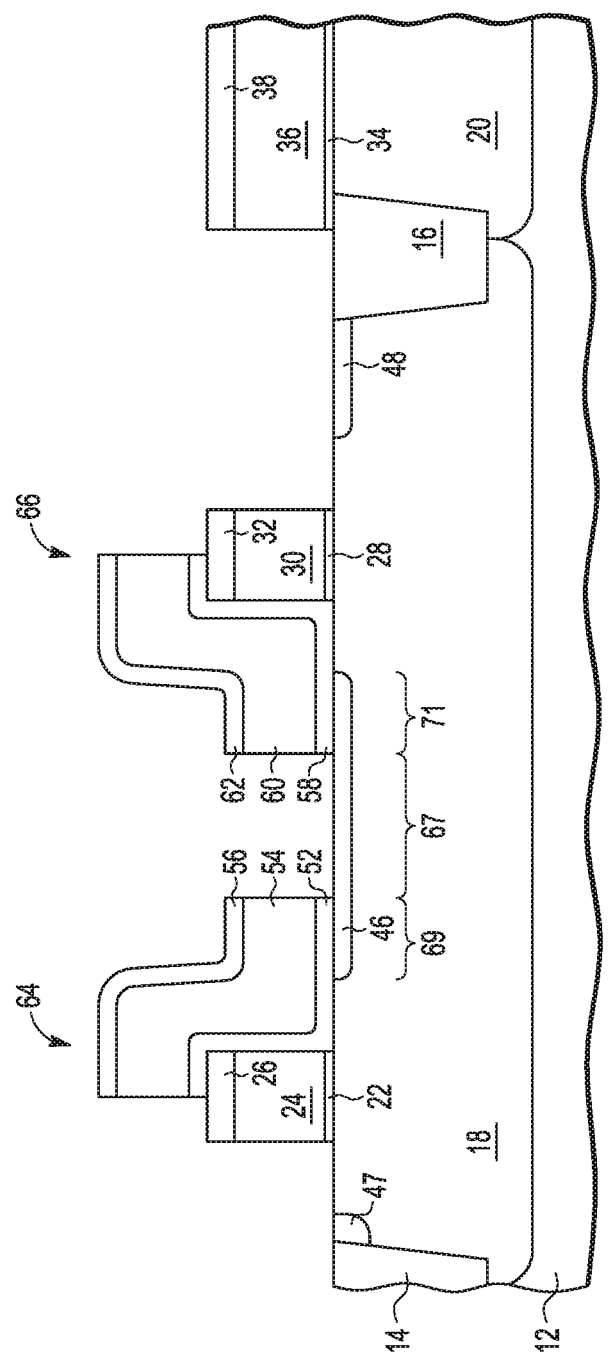

FIG. 4 illustrates a cross-sectional view of structure 10 at a subsequent processing stage. ARC layer 50, control gate layer 42 and charge storage layer 40 are patterned to result in a split gate device 64 having a charge storage layer 52 and a control gate 54, and a split gate device 66 having a charge storage layer 58 and a control gate 60. Split gate device 64 includes select gate 24 with charge storage layer 52 (formed from charge storage layer 40) and control gate 54 (formed from control gate layer 42) overlapping and along a first sidewall of select gate 24. Therefore, charge storage layer 52 is located between control gate 54 and a top surface of select gate 24, between control gate 54 and the first sidewall of select gate 24, and between control gate 54 and substrate 12. Split gate device 64 also includes ARC 56 (formed from ARC layer 50). Split gate device 66 includes select gate 30 with charge storage layer 58 (formed from charge storage layer 40) and control gate 60 (formed from control gate layer 42) overlapping and along a first sidewall of select gate 30. Therefore, charge storage layer 58 is located between control gate 60 and a top surface of select gate 30, between control gate 60 and the first sidewall of select gate 30, and between control gate 60 and substrate 12. Split gate device 66 also includes ARC 62 (formed from ARC layer 50).

Therefore, the patterning removes a portion of charge storage layer 40, control gate layer 42, and ARC layer 50 from over a first portion 67 of doped region 46 between select gates 24 and 30. Control gate 54 is over substrate 12 adjacent select gate 24 over a second portion 69 of doped region 46, and control gate 60 is over substrate 12 adjacent select gate 30 over a third portion 71 of doped region 46. Doped region 46 therefore extends under both control gate 54 (such as region 69) and control gate 60 (such as region 71). In one embodiment, doped region 46 extends under control gate 54 to a point at least a fourth of the way across control gate 54 and under control gate 60 to a point at least a fourth of the way across control gate 60. The patterning also removes charge storage layer 40, control gate layer 42, and ARC layer 50 from over gate portion 36.

Figure 5:
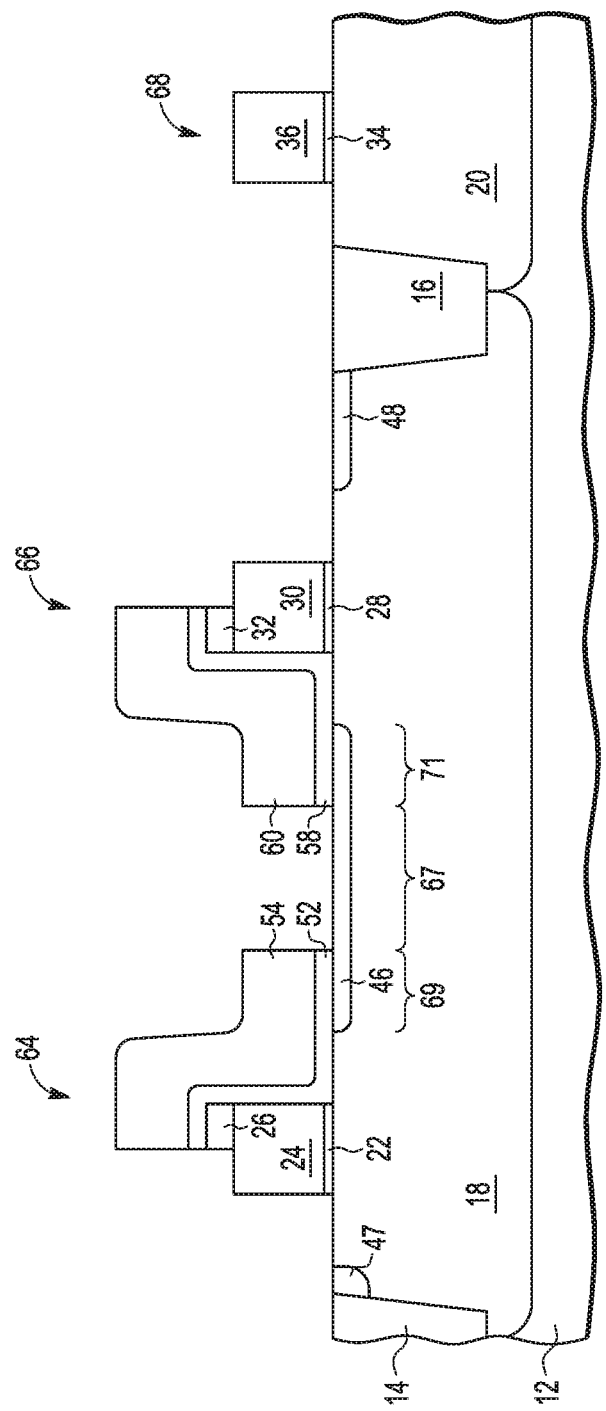

FIG. 5 illustrates a cross-sectional view of structure 10 at a subsequent processing stage. ARCs 56, 62, and 38 are removed, as well as exposed portions of ARCs 26 and 32. Gate portion 36 and gate dielectric 34 are also patterned so as to form a gate and gate dielectric of another device 68, such as, for example, a logic device.

Figure 6:
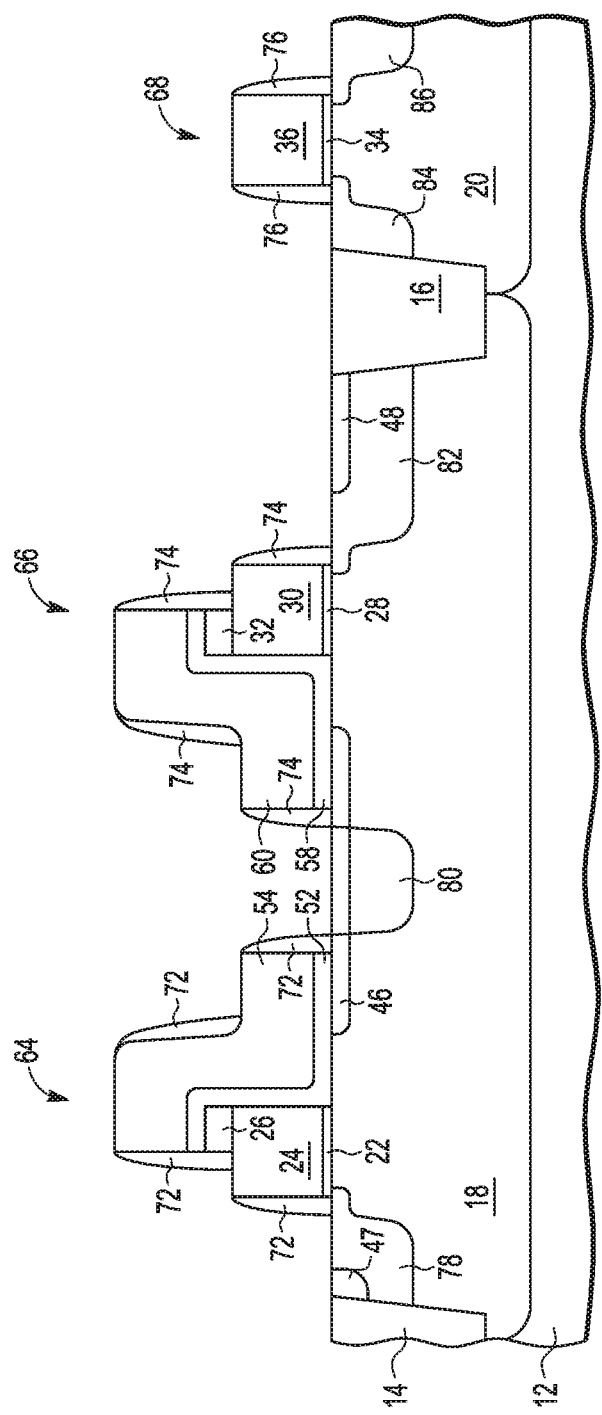

FIG. 6 illustrates a cross-sectional view of structure 10 at a subsequent processing stage. Sidewall spacer 72 is formed around split gate device 64, sidewall spacer 74 is formed around split gate device 66, and sidewall spacer 76 is formed around device 68. Sidewall spacer 72 is formed along a second sidewall of select gate 24 opposite the first sidewall, along a first sidewall of control gate 54 on top of select gate 24, along a second sidewall of control gate 54 on top of substrate 12, and along an outer surface portion (i.e. a third sidewall) of control gate 54 between the first and second sidewalls of control gate 54. Sidewall spacer 74 is formed along a second sidewall of select gate 30 opposite the first sidewall, along a first sidewall of control gate 60 on top of select gate 30, along a second sidewall of control gate 60 on top of substrate 12, and along an outer surface portion (i.e. a third sidewall) of control gate 60 between the first and second sidewalls of control gate 60. Sidewall spacer 76 is formed along first and second sidewalls of gate 36. Sidewalls 72, 74, and 76 may be formed, for example, by forming an insulating layer and performing an anisotropic etch.

Source/drain (S/D) regions 78, 80, and 82 are formed in well 18, and S/D regions 84 and 86 are formed in well 20. S/D region 80 is formed between the second sidewall of control gate 54 and the second sidewall of control gate 60, between spacers 72 and 74. S/D region 80 is formed through portion 67 of doped region 46. S/D region 78 is formed in well 18 adjacent the second sidewall of select gate 24, and a portion of S/D region 78 extends under the second sidewall of select gate 24. S/D region 82 is formed in well 18 adjacent the second sidewall of select gate 30, and a portion of S/D region 82 extends under the second sidewall of select gate 30. S/D region 84 is formed in well 20 adjacent a first sidewall of gate 36 and extends under the first sidewall of gate 36, and S/D region 86 is formed in well 20 adjacent a second sidewall of gate 36 and extends under the second sidewall of gate 36. Note that each of S/D regions 78, 82, 84, and 86 can be formed using two different implants. A first shallow implant may be used to form extensions prior to spacer formation, and a second deep implant may be used to form the deep source/drains after spacer formation. S/D region 80 may be formed with just the deep implant, without extensions, and is shared by split gate device 64 and 66. Split gate devices 64 and 66 may form a part of a non-volatile memory structure that includes any number of bit cells with split gate devices.

S/D regions 78, 80, and 82 extend deeper into substrate 12 as compared to doped region 46. In one embodiment, the depths of S/D region 80 and doped region 46 has a ratio in a range of about 2 to 15. Also, the S/D regions are implanted with the same conductivity type as region 46, but with a concentration of about 2 magnitudes greater that the S/D regions. Doped region 46 extends under the corner formed by control gate 54 at the second sidewall of control gate 54, adjacent S/D region 80, and under the corner formed by control gate 60 at the second sidewall of control gate 60, adjacent S/D region 80. S/D region 80 corresponds to the source of split gate devices 64 and 66, and trap up is usually worse at the source side. Therefore, by doped region 46 extending under these corners, the trapped charges can be shielded, thus reducing their effects on the devices. Note that doped region 46 is also spaced apart from each of select gate 24 and 30 so as not to adversely impact operation.

Figure 7:
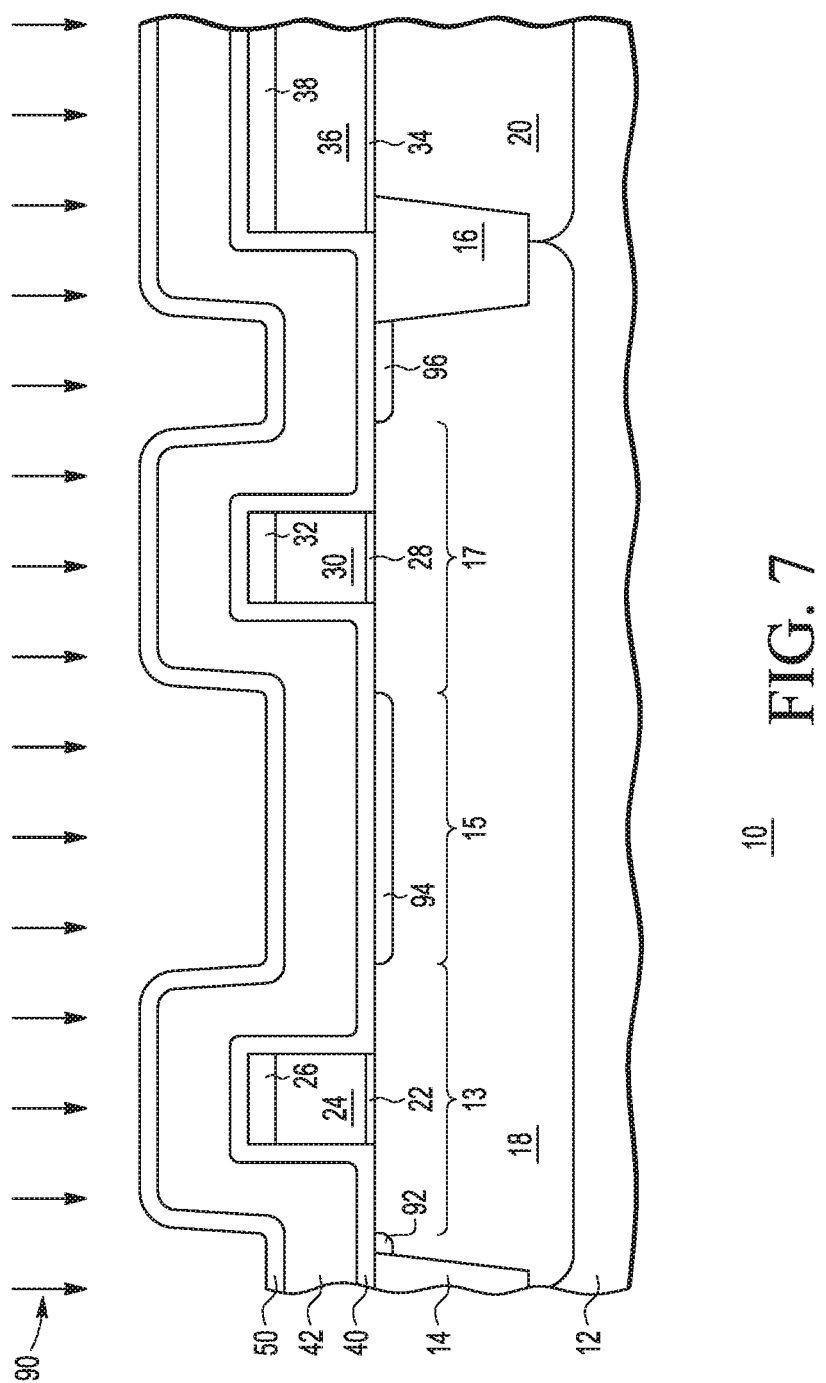
FIGS. 7-8 illustrate a second semiconductor device at various processing stages in accordance with one embodiment of the present invention.

FIG. 7 illustrates a cross-sectional view of structure 10 according to an alternate embodiment in which like numerals indicate like elements. Referring back to the processing stage of FIG. 1, in which control gate layer 42 has been formed conformally over charge storage layer 40, rather than performing implant 44 (as in FIG. 2), ARC layer 50 is first formed over control gate layer 42. After forming ARC layer 50, implant 90 is performed, which is similar to implant 44. Implant 90 is performed with an energy (or strength) such that a fraction of the dopants will penetrate through ARC layer 50 and control gate layer 42 into substrate 12 to result in doped region 92, 94, and 96 but not penetrate ARC layers 26 and 32 and control gate layer 42 in regions 13 and 17. Therefore, doped region 94 in region 15 is similar to doped region 46 (and can have similar dopant types and concentrations) but is laterally shifted inwards at both ends. That is, doped region 94 is spaced apart from select gates 24 and 30 farther than doped region 46 is spaced apart from select gates 24 and 30. This is due to the added thickness of ARC layer 50 that is present before the implant, making regions 13 and 17 wider and region 15 narrower.

Figure 8:
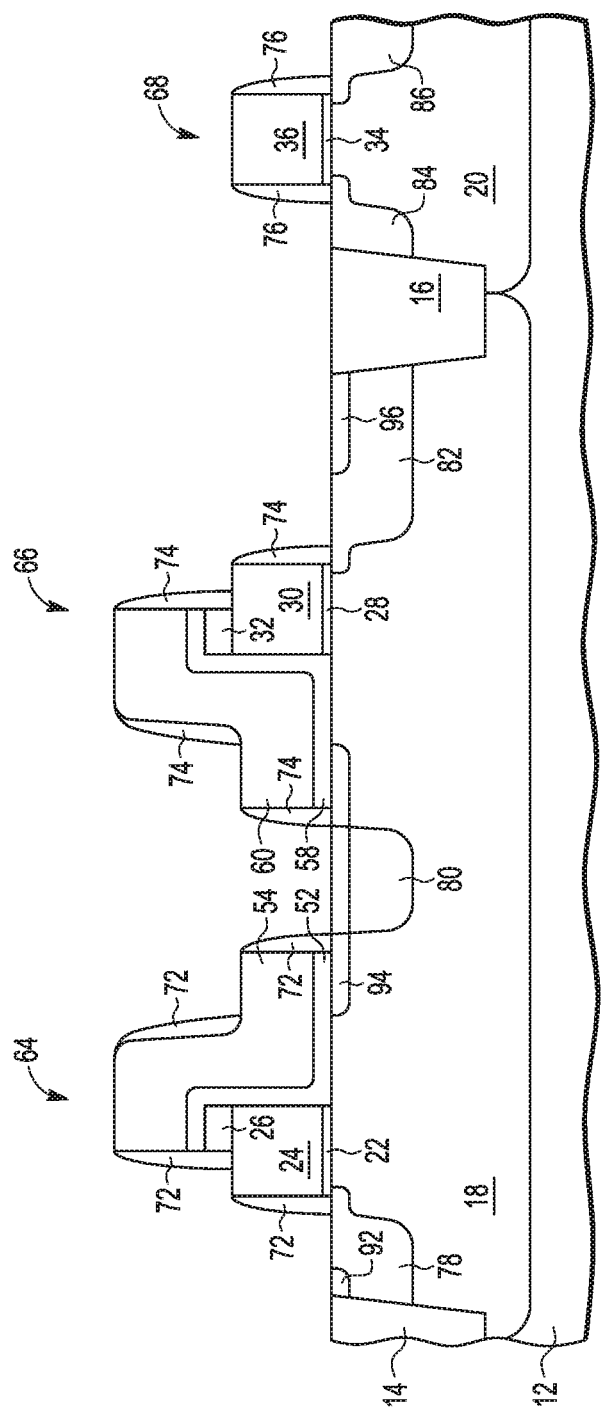

FIG. 8 illustrates a cross-sectional view of structure 10 as processed in accordance to the alternate embodiment described in FIG. 7. That is, the subsequent processing may be the same as described above in reference to FIGS. 4-6 to form split gate devices 64 and 66. Therefore, depending on the desired width of doped regions 46 and 94, the implant 44 or 90 may be performed before or after formation of ARC layer 50 over control gate layer 42. As with doped region 46, doped region 94 extends under the corner formed by control gate 54 at the second sidewall of control gate 54, adjacent S/D region 80, and under the corner formed by control gate 60 at the second sidewall of control gate 60, adjacent S/D region 80. Therefore, doped region 94 similarly shields the trapped charges, thus reducing their effects on the devices.

Figure 9:
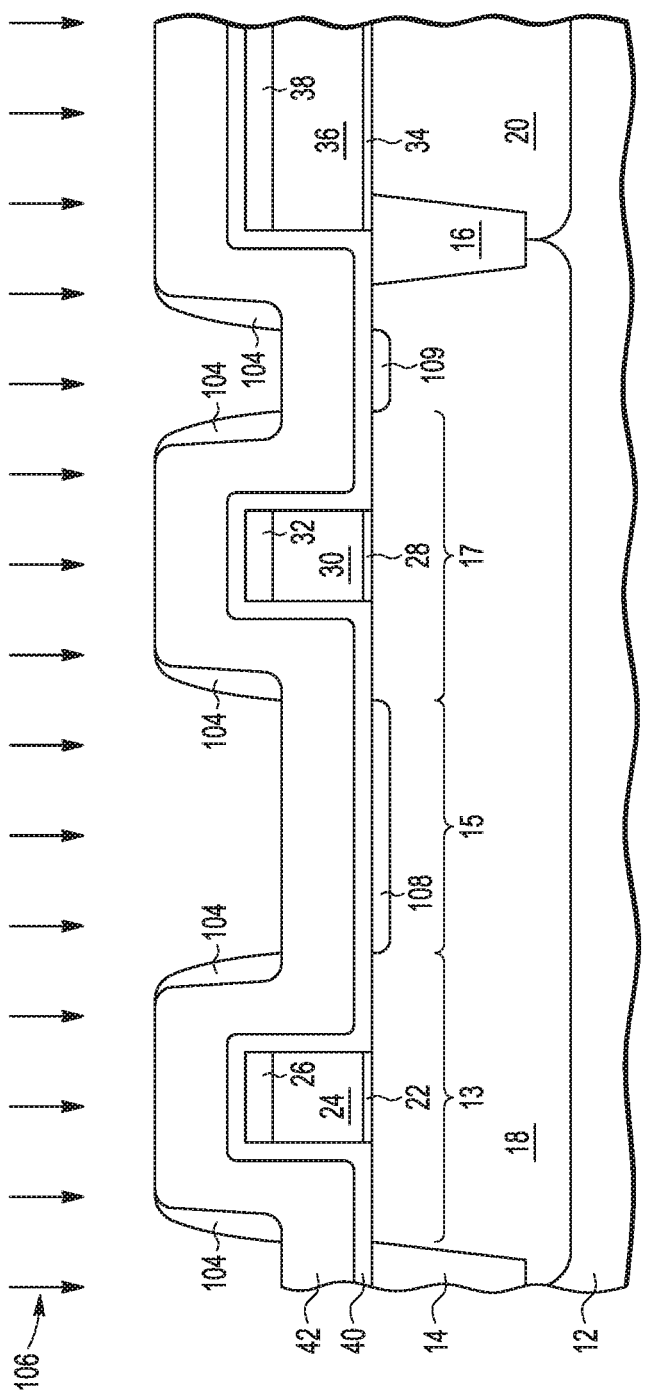
FIGS. 9-11 illustrate a third semiconductor device at various processing stages in accordance with one embodiment of the present invention.

FIG. 9 illustrates a cross-sectional view of a semiconductor structure 100 according to an alternate embodiment in which like numerals indicate like elements. Referring back to the processing stage of FIG. 1, rather than performing implant 44 (as in FIG. 2), spacers 104 are formed along sidewalls of control gate layer 42. For example, as seen in FIG. 9, control gate layer 42 includes two sidewalls between select gates 24 and 30, in which a first sidewall is closer to select gate 24 rather than select gate 30 and a second sidewall is closer to select gate 30 rather than select gate 24. In one embodiment, spacers 104 are formed on these sidewalls by forming an insulating layer and then performing an anisotropic etch. They may be formed using a dielectric material, such as an oxide or a nitride. After formation of spacers 104, an implant 106 is performed, which is similar to implant 44. Implant 106 is performed with an energy (or strength) such that a fraction of the dopants will penetrate through control gate layer 42 into substrate 12 to result in doped regions 108 and 109 but not penetrate ARC layers 26 and 32 and control gate layer 42 in regions 13 and 17. Therefore, doped region 108 in region 15 is similar to doped region 46 (and can have similar dopant types and concentrations) but is laterally shifted inwards at both ends due to the presence of spacers 104. Spacers 104 add thickness above control gate layer 42 that prevents the dopants from penetrating into substrate 12 under the spacers. Therefore, doped region 108 is spaced apart from select gates 24 and 30 farther than doped region 46 is spaced apart from select gates 24 and 30. The thickness of spacers 104 can be controlled to change the width of region 15 and thus control the width of doped region 108.

Figure 10:
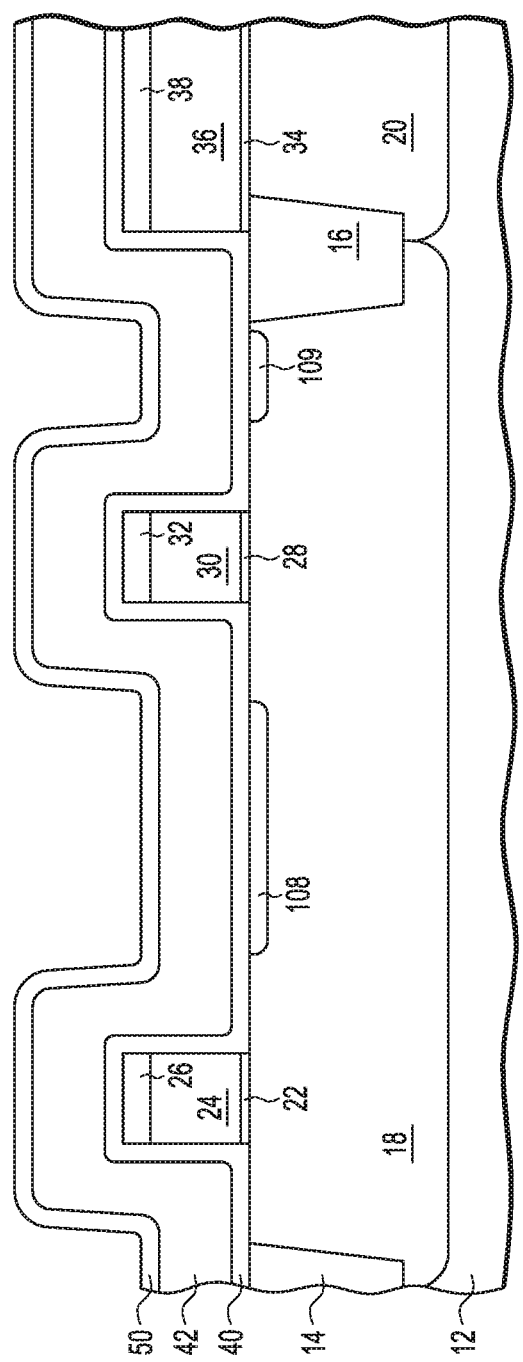
Figure 11:
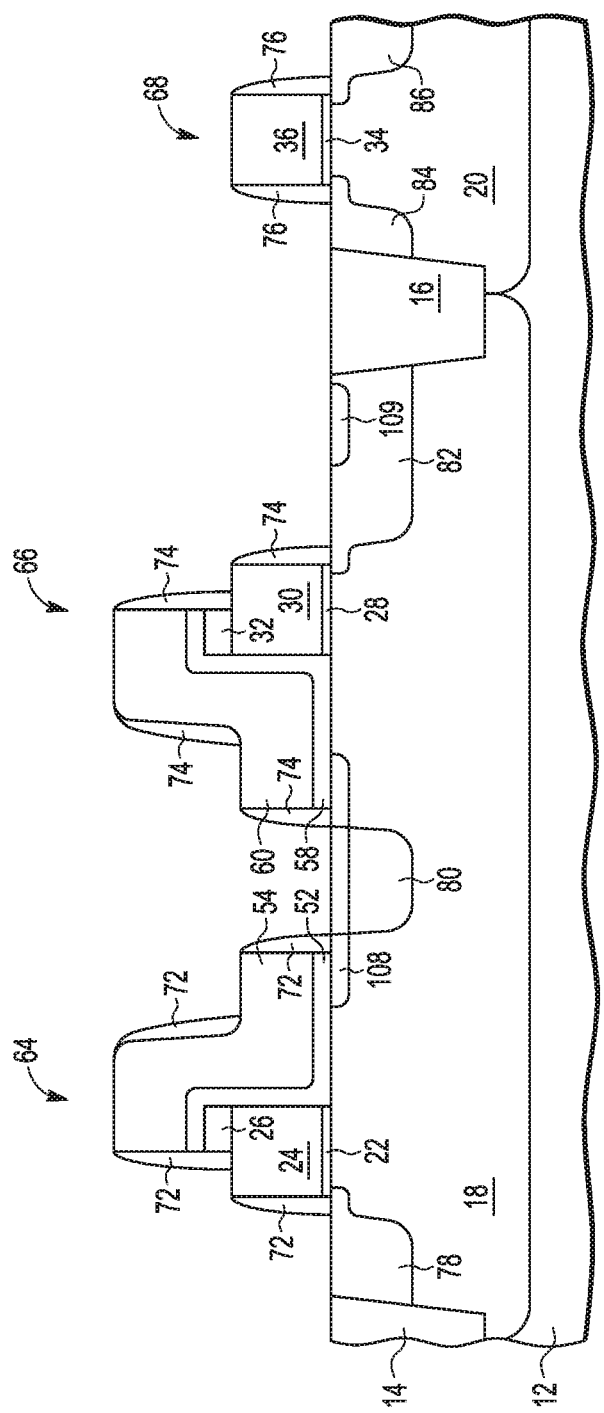

FIG. 10 illustrates a cross-sectional view of semiconductor 100 at a subsequent processing stage. After implant 106, spacers 104 are removed. Therefore, note that spacers 104 may be referred to as sacrificial spacers. After removal of spacers 104, ARC layer 50 is formed over control gate layer 42. ARC layer 50 includes an insulating layer, such as nitride or oxynitride FIG. 11 illustrates a cross-sectional view of semiconductor 100 at a subsequent processing stage. After removal of spacers 104, the subsequent processing may be the same as described above in reference to FIGS. 4-6 to form split gate devices 64 and 66. As with doped regions 46 and 94, doped region 108 extends under the corner formed by control gate 54 at the second sidewall of control gate 54, adjacent S/D region 80, and under the corner formed by control gate 60 at the second sidewall of control gate 60, adjacent S/D region 80. Therefore, doped region 108 similarly shields the trapped charges, thus reducing their effects on the devices.

Figure 12:
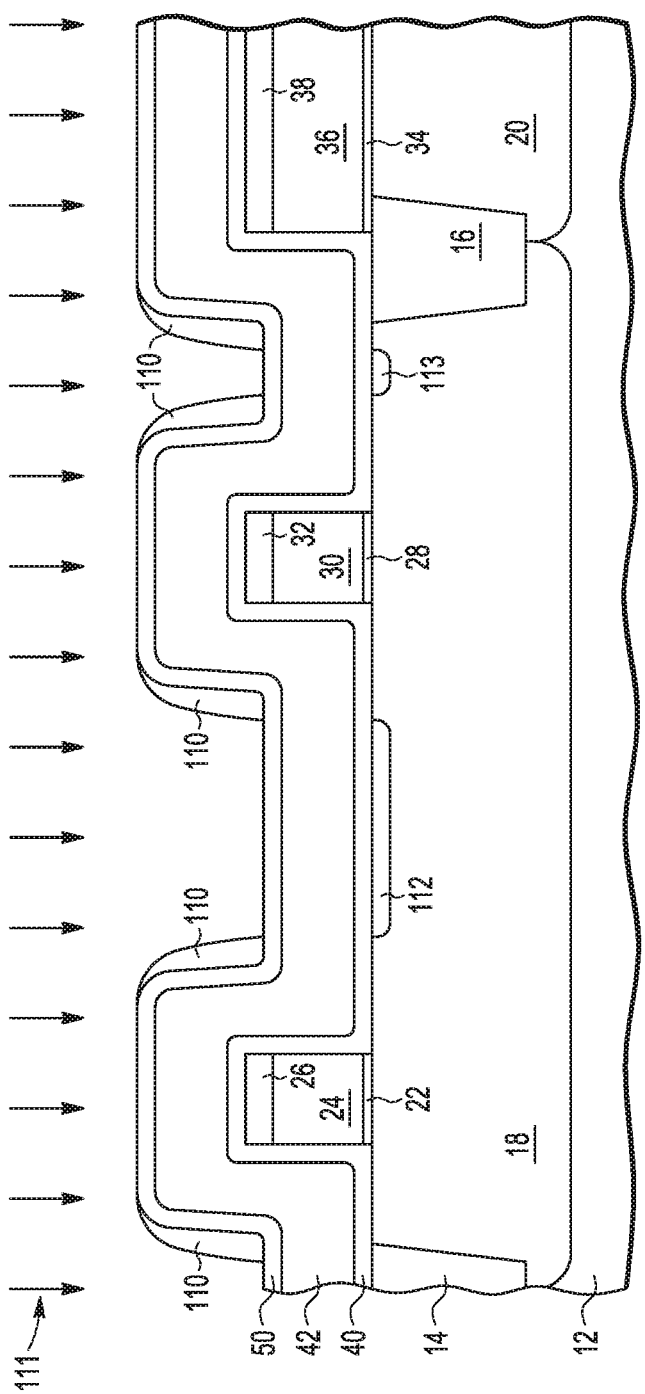
FIGS. 12-13 illustrate a fourth semiconductor device at various processing stages in accordance with one embodiment of the present invention.

FIG. 12 illustrates a cross-sectional view of semiconductor structure 100 according to alternate embodiment. Referring back to the processing stage of FIG. 1, in which control gate layer 42 has been formed conformally over charge storage layer 40, rather than performing implant 44 (as in FIG. 2), ARC layer 50 is first formed over control gate layer 42. After forming ARC layer 50, spacers 110 are formed along sidewalls of ARC layer 50, similar to spacers 104 formed on sidewalls of control gate layer 42. For example, as seen in FIG. 12, ARC layer 50 includes two sidewalls between select gates 24 and 30, in which a first sidewall is closer to select gate 24 rather than select gate 30 and a second sidewall is closer to select gate 30 rather than select gate 24. In one embodiment, spacers 110 are formed on these sidewalls of ARC layer 50 by forming an insulating layer and then performing an anisotropic etch. They may be formed using a dielectric material, such as an oxide or a nitride. After formation of spacers 110, an implant 111 is performed, which is similar to implant 44. Implant 111 is performed with an energy (or strength) such that a fraction of the dopants will penetrate through control gate layer 42 into substrate 12 to result in doped regions 112 and 113 but not penetrate ARC layers 26 and 32 and control gate layer 42 in regions 13 and 17. Therefore, doped region 112 in region 15 is similar to doped region 108 (and can have similar dopant types and concentrations) but is laterally shifted inwards at both ends due to the presence of ARC layer 50 under spacers 110. The added thickness of ARC layer 50 before the implant makes regions 13 and 17 wider and region 15 narrower.

Figure 13:
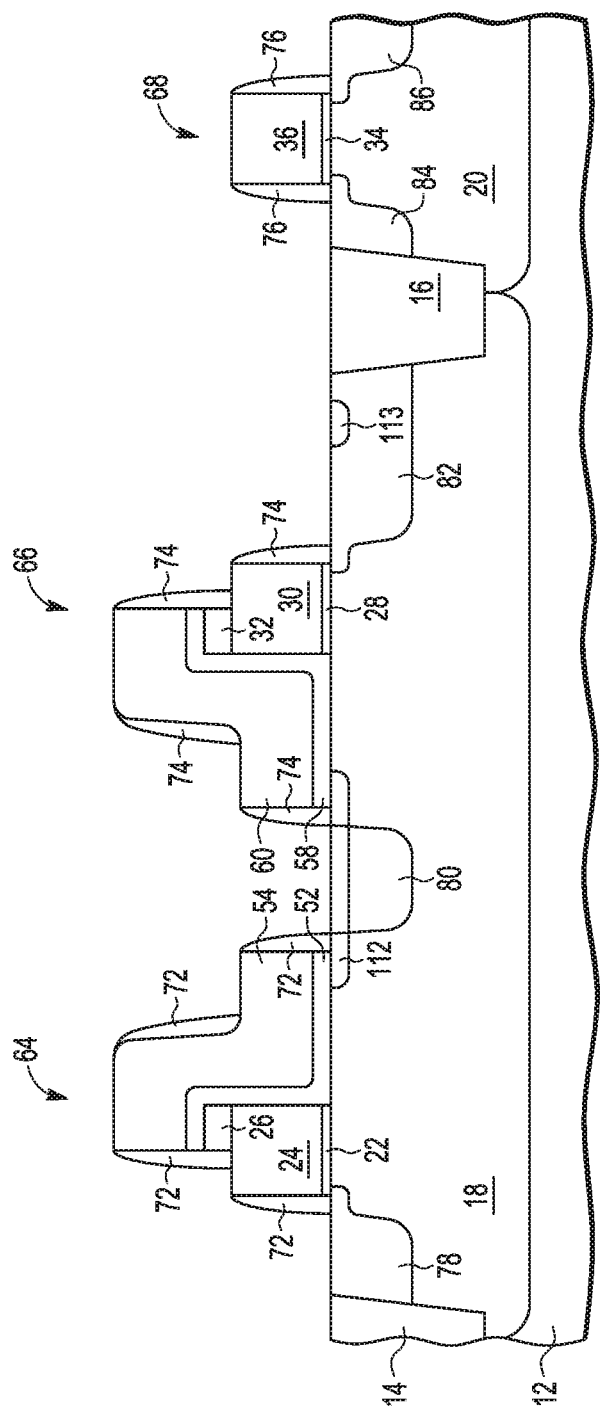

FIG. 13 illustrates a cross-sectional view of semiconductor 100 at a subsequent processing stage processed in accordance to the alternate embodiment described in FIG. 12. That is, the subsequent processing may be the same as described above in reference to FIGS. 4-6 to form split gate devices 64 and 66. Note that during this subsequent processing, as with spacers 104, spacers 110 are removed and may also be referred to as sacrificial spacers. Therefore, depending on the desired width of doped region 108 and 112, the implant 106 or 111 may be performed before or after formation of ARC layer 50 over control gate layer 42. As with doped region 106, doped region 112 extends under the corner formed by control gate 54 at the second sidewall of control gate 54 and adjacent S/D region 80 and under the corner formed by control gate 60 at the second sidewall of control gate 60 and adjacent S/D region 80. Therefore, doped region 112 similarly shields the trapped charges, thus reducing their effects on the devices.

Figure 14:
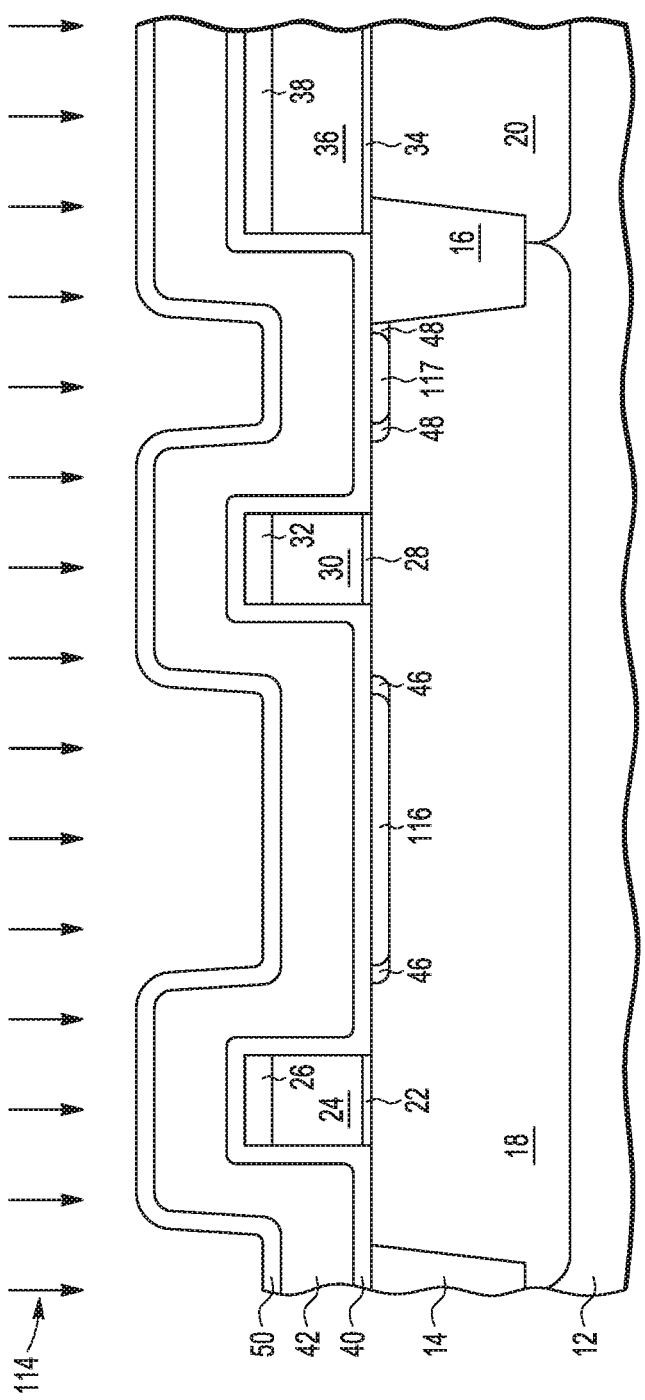
FIGS. 14-15 illustrate a fifth semiconductor device at various processing stages in accordance with one embodiment of the present invention.

FIG. 14 illustrates a cross-sectional view of a semiconductor device 110 according to an alternate embodiment in which like numerals indicate like elements. Referring back to the processing stage of FIG. 3, prior to patterning ARC layer 50, control gate layer 42, and charge storage layer 40, a second implant 114 is performed after the first implant 44. That is, implant 44 is performed, as described above, and ARC layer 50 is then formed over charge storage layer 42.

After formation of ARC layer 50, implant 114 is performed resulting in doped region 116 which is narrower than doped region 46. As with implant 44, implant 114 is performed with an energy (or strength) such that a fraction of the dopants will penetrate ARC layers 26 and 32 and through control gate layer 42 into substrate 12 to result in doped regions 116 and 117 but not penetrate ARC layers 26 and 32 and control gate layer 42 in regions 13 and 17. Therefore, doped region 116 in region 15 overlaps region 46 but is narrower. This allows stepped or more graded dopant profiles to be formed at the end of regions 46 and 116 when so desired.

Figure 15:
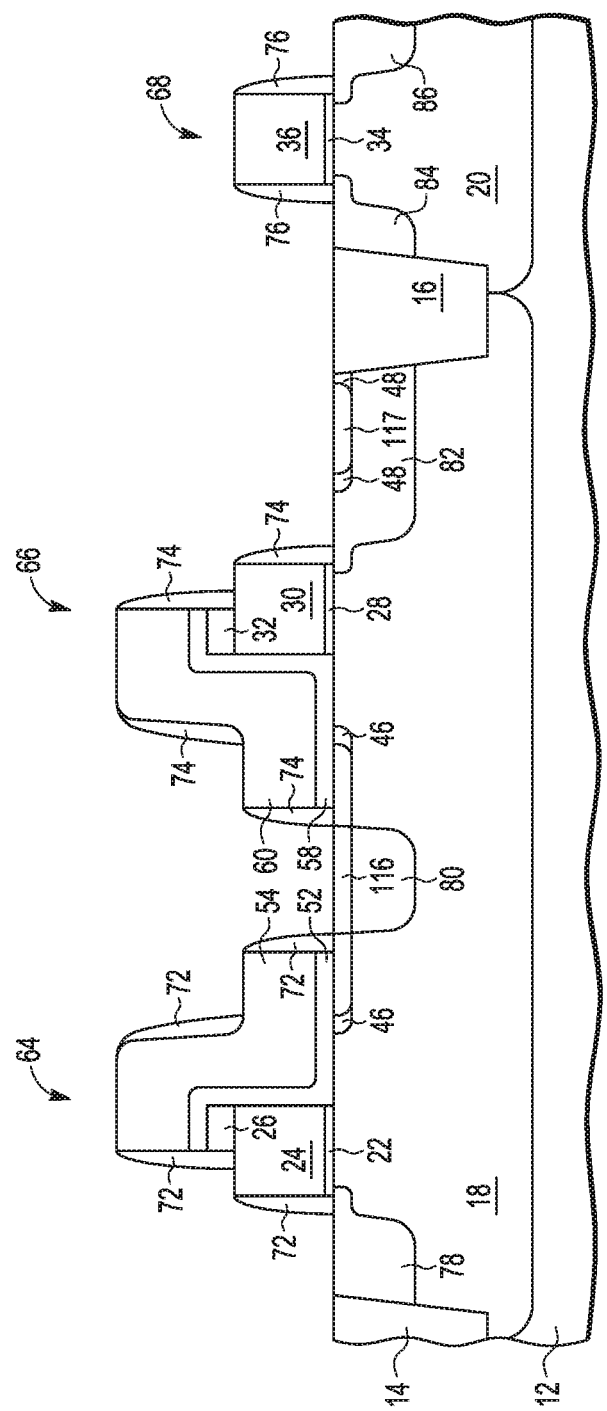

FIG. 15 illustrates a cross-sectional view of semiconductor 110 at a subsequent processing stage. After implant 114, the subsequent processing may be the same as described above in reference to FIGS. 4-6 to form split gate devices 64 and 66. As with doped region 46, doped regions 46 and 116 extend under the corner formed by control gate 54 at the second sidewall of control gate 54, adjacent S/D region 80, and under the corner formed by control gate 60 at the second sidewall of control gate 60, adjacent S/D region 80. Therefore, doped regions 46 and 116 similarly shields the trapped charges, thus reducing their effects on the devices.

In the embodiments described above, after performing the implant to result in doped regions 46, 94, 108, 112, and 116, an anneal may be performed in which heat diffusion laterally moves the edges of the doped regions closer to control gates 54 and 60 (i.e. widens the doped regions). In this case, the doped regions can be closer to the control gates for better shielding of the trapped charges without having to implant so close to the control gate edge. The use of the ARC layer and sacrificial spacers also help ensure that the implant is not too close to the control gate edges near the select gates because if too close, the implants can damage the layers.

Therefore, by now it can be appreciated how the effects of trap-up can be reduced through a selective implant through part of the control gate layer to place dopants at the channel surface region near the source edge. The placement of the dopants can be controlled by, for example, controlling the strength of the implant, the timing of the implant (e.g. before or after ARC layer formation), and through the use of sacrificial spacers. In this manner, the trapped charges can be shielded to reduce their undesirable effects on the device.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the structure of the nonvolatile memory including split gate devices 64 and 66 can have a variety of different circuit designs. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a method of forming a semiconductor device using a substrate, includes forming a first isolation region in the substrate, a first select gate over the substrate, a second select gate over the substrate spaced from the first select gate, a charge storage layer over the substrate including over the first and second select gates, and a control gate layer over the charge storage layer whereby the control gate layer has a top surface further from a top surface of the substrate (1) in a first region over and laterally adjacent to the first select gate and (2) in a second region over and laterally adjacent to the second select gate than in a third region between the first and second select gates; performing a first implant with a strength sufficient to reach the substrate in the third region to form a doped region in the substrate and not sufficient to reach the substrate in the first and second regions; and removing the control gate layer over a first portion of the doped region between the first select gate and the second select gate to leave a first control gate over the substrate adjacent to the first select gate and over a second portion of the doped region to leave a second control gate over the substrate adjacent to the second select gate and over a third portion of the doped region. In one aspect, the method includes forming an insulating layer over the control gate layer; wherein the performing the first implant is performed after forming the insulating layer. In a further aspect, the method further includes removing the insulating layer over the first portion of the doped region prior to the removing of the control gate layer over the first portion of the doped region. In yet a further aspect, the insulating layer has a first sidewall between the first and second select gates and a second sidewall between the first and second select gates, the first sidewall is closer to the first select gate than the second select gate, and the second sidewall is closer to the second select gate than the first select gate, and the method further includes forming a first sidewall spacer on the first sidewall and a second sidewall spacer on the second sidewall, wherein the first and second sidewall spacers are formed prior to the performing the first implant. In another yet further aspect, the control gate layer has a first sidewall between the first and second select gates and a second sidewall between the first and second select gates, the first sidewall of the control gate layer is closer to the first select gate than the second select gate, and the second sidewall of the select gate layer is closer to the second select gate than the first select gate, and the method further includes forming a third sidewall spacer on the first sidewall of the control gate layer and a fourth sidewall spacer on the second sidewall of the control gate layer, wherein the third and fourth sidewall spacers are formed prior to the performing the implant. In a further aspect, the method further includes performing a second implant prior to forming the insulating layer. In another further aspect, the second implant is performed after forming the second and third sidewall spacers. In another aspect of the above embodiment, the method further includes forming a first anti-reflective coating over the first select gate and second anti-reflective coating over the second select gate prior to forming the charge storage layer.

In another embodiment, a method of forming a semiconductor device using a substrate, includes forming a first select gate over the substrate; forming a second select gate, spaced from the first select gate, over the substrate; forming a charge storage layer over the first select gate, over the second select gate, and over the substrate in a region between the first select gate and the second select gate, wherein the charge storage layer is conformal; forming a control gate layer over the charge storage layer, wherein the control gate layer is conformal; performing a first implant that penetrates through the control gate layer in a middle portion of the region between the first select gate and the second select gate to the substrate to form a doped region in the substrate in a first portion of the region between the first select gate and the second select gate that does not reach the first select gate and does not reach the second select gate. In one aspect, the method further includes forming a first insulating layer over the control gate layer. In a further aspect, the performing the first implant occurs after forming the first insulating layer. In yet a further aspect, the performing the first implant occurs before forming the first insulating layer. In yet even a further aspect, the method further includes performing a second implant after forming the first insulating layer. In another aspect of the another embodiment, the control gate layer has a first sidewall and a second sidewall between the first select gate and the second select gate, and the method further includes forming a first sidewall spacer on the first sidewall; forming a second sidewall spacer on the second sidewall; wherein the performing the first implant occurs after the forming the first sidewall spacer and the forming the second sidewall spacer. In a further aspect, the method further includes forming a first insulating layer over the control gate layer, wherein the first insulating layer is conformal; and performing a second implant through the first insulating later and into a second portion of the region between the first select gate and the second select gate that is within the first portion and less than the first portion. In another aspect, the insulating layer has a first sidewall and a second sidewall between the first select gate and the second select gate, and the method further includes forming a first sidewall spacer on the first sidewall; and forming a second sidewall spacer on the second sidewall; wherein the performing the first implant occurs after the forming the first sidewall spacer and the forming the second sidewall spacer. In another further aspect, the charge storage layer includes nanocrystals.

18. In yet another embodiment, a non-volatile memory structure includes a first select gate over a substrate; a second select gate over the substrate; a first charge storage layer along a first sidewall of a first side of the first select gate and over a first portion of the substrate adjacent to the first select gate; a second charge storage layer along a first sidewall of a first side of the second select gate and over a second portion of the substrate adjacent to the second select gate; a first source/drain region in the substrate on a second side of the first select gate; a second source/drain region in the substrate on a second side of the second select gate; a first control gate over the first charge storage layer where the first charge storage layer is over the first portion of the substrate, wherein the first control gate has a first side along the first charge storage layer, and the first control gate has a second side; a second control gate over the second charge storage layer where the second charge storage layer is over the second portion of the substrate, wherein the second control gate has a first side along the second charge storage layer, and the second control gate has a second side; a third source/drain region in the substrate between the second side of the first control gate and the second side of the second control gate; a first doped region in the substrate extending from the third source/drain region to under the first control gate to a point at least a fourth of the way across the first control gate; and a second doped region in the substrate extending from the third source/drain region to under the second control gate to a point at least a fourth of the way across the second control gate, wherein the first, second, and third source/drain regions have a first depth and a first conductivity type, and the first and second doped regions have a second depth, which is less than one fourth of the first depth, and the first conductivity type. In one aspect, the structure further includes a well formed in the substrate and having a second conductivity type, wherein the first, second, and third source/drains and the first and second doped regions are in the well. In a further aspect, the structure further includes a third doped region in the third source/drain region connecting the first and second doped regions, wherein the third doped region has the second depth.

What is claimed is:
1. A method of forming a semiconductor device using a substrate, comprising:
forming a first isolation region in the substrate, a first select gate over the substrate, a second select gate over the substrate spaced from the first select gate, a charge storage layer over the substrate including over the first and second select gates, and a control gate layer over the charge storage layer whereby the control gate layer has a top surface further from a top surface of the substrate (1) in a first region over and laterally adjacent to the first select gate and (2) in a second region over and laterally adjacent to the second select gate than in a third region between the first and second select gates, and wherein the control gate layer is continuous between the first and second select gates directly over the third region;
performing a first implant through the control gate layer with a strength sufficient to reach the substrate in the third region to form a doped region in the substrate and not sufficient to reach the substrate in the first and second regions; and
after performing the first implant, removing the control gate layer over a first portion of the doped region between the first select gate and the second select gate to leave a first control gate over the substrate adjacent to the first select gate and over a second portion of the doped region to leave a second control gate over the substrate adjacent to the second select gate and over a third portion of the doped region.
2. The method of claim 1 comprising:
forming an insulating layer over the control gate layer; wherein:

the performing the first implant is performed after forming the insulating layer.

3. The method of claim 2, further comprising removing the insulating layer over the first portion of the doped region prior to the removing of the control gate layer over the first portion of the doped region.

4. The method of claim 3, wherein, prior to the removing the insulating layer over the first portion of the doped region, the insulating layer has a first sidewall between the first and second select gates and a second sidewall between the first and second select gates, the first sidewall is closer to the first select gate than the second select gate, and the second sidewall is closer to the second select gate than the first select gate, further comprising:
forming a first sidewall spacer on the first sidewall and a second sidewall spacer on the second sidewall, wherein the first and second sidewall spacers are formed prior to the performing the first implant.

5. The method of claim 1, wherein the control gate layer has a first sidewall between the first and second select gates and a second sidewall between the first and second select gates, the first sidewall of the control gate layer is closer to the first select gate than the second select gate, and the second sidewall of the select gate layer is closer to the second select gate than the first select gate, further comprising:
forming a first sidewall spacer on the first sidewall of the control gate layer and a second sidewall spacer on the second sidewall of the control gate layer, wherein the first and second sidewall spacers are formed prior to the performing the first implant.

6. The method of claim 1 further comprising:
forming an insulating layer over the control gate layer, wherein the first implant is performed prior to forming the insulating layer; and
after forming the insulating layer, performing a second implant through the control gate layer to form a second doped region in the substrate.

7. The method of claim 6, wherein the second doped region in the substrate overlaps the doped region but is narrower than the doped region.

8. The method of claim 1, further comprising forming a first anti-reflective coating over the first select gate and second anti-reflective coating over the second select gate prior to forming the charge storage layer.

9. The method of claim 1, wherein after the removing the control gate layer over the first portion of the doped region to leave the first control gate and over the second portion of the doped region to leave a second control gate, the doped region extends under at least a portion of the first control gate and under at least a portion of the second control gate.

10. A method of forming a semiconductor device using a substrate, comprising:
forming a first select gate over the substrate;
forming a second select gate, spaced from the first select gate, over the substrate;
forming a charge storage layer over the first select gate, over the second select gate, and over the substrate in a region between the first select gate and the second select gate, wherein the charge storage layer is conformal;
forming a control gate layer over the charge storage layer, wherein the control gate layer is conformal;
performing a first implant that penetrates through the control gate layer in a middle portion of the region between the first select gate and the second select gate to the substrate to form a doped region in the substrate directly under the control gate layer in a first portion of the region between the first select gate and the second select gate that does not reach the first select gate and does not reach the second select gate.

11. The method of claim 10 further comprising forming a first insulating layer over the control gate layer.

12. The method of claim 11, wherein the performing the first implant occurs after forming the first insulating layer.

13. The method of claim 11, wherein the performing the first implant occurs before forming the first insulating layer.

14. The method of claim 13, further comprising performing a second implant after forming the first insulating layer.

15. The method of claim 11 wherein the insulating layer has a first sidewall and a second sidewall between the first select gate and the second select gate, further comprising:
forming a first sidewall spacer on the first sidewall; and
forming a second sidewall spacer on the second sidewall;
wherein the performing the first implant occurs after the forming the first sidewall spacer and the forming the second sidewall spacer.

16. The method of claim 10, wherein the control gate layer has a first sidewall and a second sidewall between the first select gate and the second select gate, further comprising:
forming a first sidewall spacer on the first sidewall;
forming a second sidewall spacer on the second sidewall;
wherein the performing the first implant occurs after the forming the first sidewall spacer and the forming the second sidewall spacer.

17. The method of claim 10 further comprising:
forming a first insulating layer over the control gate layer, wherein the first insulating layer is conformal; and
performing a second implant through the first insulating later and into a second portion of the region between the first select gate and the second select gate that is within the first portion and less than the first portion.

18. The method of claim 10, wherein the charge storage layer comprises nanocrystals.

19. The method of claim 10, further comprising:
after performing the first implant, removing the control gate layer over a first portion of the doped region between the first select gate and the second select gate to leave a first control gate over the substrate adjacent to the first select gate and over a second portion of the doped region to leave a second control gate over the substrate adjacent to the second select gate and over a third portion of the doped region.

20. The method of claim 19, wherein after the removing the control gate layer over the first portion of the doped region to leave the first control gate and over the second portion of the doped region to leave a second control gate, the doped region extends under at least a portion of the first control gate and under at least a portion of the second control gate.

* * * * *